United States Patent
Wang et al.

(10) Patent No.: US 8,425,681 B1
(45) Date of Patent: Apr. 23, 2013

(54) LOW-DISLOCATION-DENSITY EPITATIAL LAYERS GROWN BY DEFECT FILTERING BY SELF-ASSEMBLED LAYERS OF SPHERES

(75) Inventors: George T. Wang, Albuquerque, NM (US); Qiming Li, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 1090 days.

(21) Appl. No.: 12/388,103

(22) Filed: Feb. 18, 2009

(51) Int. Cl.
*C30B 21/04* (2006.01)

(52) U.S. Cl.
USPC ................ 117/96; 117/98; 117/99; 117/104

(58) Field of Classification Search .................... 117/96, 117/98, 99, 104
See application file for complete search history.

(56) References Cited

U.S. PATENT DOCUMENTS

| | | | |
|---|---|---|---|
| 7,309,620 B2 * | 12/2007 | Fonash et al. | 438/53 |
| 2006/0056474 A1 * | 3/2006 | Fujimoto et al. | 372/43.01 |
| 2010/0320506 A1 * | 12/2010 | Varangis et al. | 257/201 |

OTHER PUBLICATIONS

Sung Jin An et al, "Heteroepitaxial Growth of High-Quality GaN Thin Films on Si Substrates Coated with Self-Assembled Sub-micrometer-sized Silica Balls", Advanced Materials, 2006, 18, pp. 2833-2836.

Jazynasa Yeda, et al, "High performance of GaN thin films grown on sapphire substrates coated with a silica-submicron-sphere monolayer film", Applied Physics Letters, 92, 2008, pp. 101101-1 thru 101101-3.

* cited by examiner

*Primary Examiner* — Bob M Kunemund
(74) *Attorney, Agent, or Firm* — Carol Ashby; Kevin Bieg

(57) ABSTRACT

A method for growing low-dislocation-density material atop a layer of the material with an initially higher dislocation density using a monolayer of spheroidal particles to bend and redirect or directly block vertically propagating threading dislocations, thereby enabling growth and coalescence to form a very-low-dislocation-density surface of the material, and the structures made by this method.

17 Claims, 5 Drawing Sheets

LOW-DISLOCATION-DENSITY EPITATIAL LAYERS GROWN BY DEFECT FILTERING BY SELF-ASSEMBLED LAYERS OF SPHERES

The United States Government has rights in this invention pursuant to Department of Energy Contract No. DE-AC04-94AL85000 with Sandia Corporation.

BACKGROUND OF THE INVENTION

This invention relates to a method of growing low-dislocation-density material atop a substrate that is sufficiently lattice mismatched to the material that numerous threading dislocations normally form during the growth process or during the cool-down after growth. An example where such a problem is encountered is Group III nitride materials.

The growth of many materials, including Group III nitride-based materials, relies on heteroepitaxy on substrates that often have appreciably different lattice constants and thermal expansion coefficients than the material being grown upon it. This can lead to a very high density of dislocations in the resulting films. In the case of Group III nitride materials, high densities of dislocations degrade the electronic and optical properties of the nitride materials and degrade the performance of devices made therefrom. Hence, it would be highly desirable to have an easy-to-implement way to reduce the dislocation density in heteroepitaxially grown layers.

An and coworkers have reported maskless heteroepitaxial growth of GaN on a Si substrate with a self-assembled sub-micrometer-sized silica-ball layer (S. J. An, Y. J. Hong, G.-C. Yi, Y.-J. Kim, and C. K. Lee, "Heteroepitaxial Growth of High-Quality GaN Thin Films on Si Substrates Coated with Se-lf-Assembled Sub-micrometer-sized Silica Balls," Adv. Mater. vol. 18 (2006) pp. 2833-2836). In the method of An, prior to the GaN layer growth, AlN buffer layers were deposited on the silica-ball-coated substrates in order to prevent meltback etching. The silica balls had been placed on the substrate prior to AlN growth to form an SBS substrate. Prior to the growth of the AlN buffer layer on the SBS substrates, oxide layers on the Si substrate surfaces were removed by annealing under a hydrogen flow at high temperature (1100° C.). An 80 nm AlN buffer layer with a few monolayers of predeposited Al was deposited on the SBS substrates, and GaN films were grown on the AlN buffer layers.

Ueda and coworkers report a modification of the method of An (K. Ueda, Y. Tsuchida, N. Hagura, F. Iskandar, K. Okuyama, and Y. Endo, "High performance of GaN thin films grown on sapphire substrates coated with a silica-submicron-sphere monolayer film. Ueda employs sapphire substrates, which are used because the transparent properties of sapphire substrates are superior to those of Si substrates. First, silica submonolayer films were deposited on the sapphire substrates using a spin-coating method. Ueda states that the spin-coating method has practical advantages in terms of production rate and uniformity compared with other sol-gel methods, such as dip coating, wet coating, and the Langmuir-Blodgett. In the method of Ueda, sapphire substrates were cleaned with buffered hydrofluoric acid. The silica colloid suspension was dropped onto the center of the substrates when spinning is begun. The silica balls were on the sapphire substrate before the first GaN growth. GaN films were grown on the sapphire substrates coated with silica spheres using MOCVD. A low-temperature GaN buffer layer was grown at 485° C. and 1 atmosphere, an undoped AlGaN layer (at 800° C.) and undoped GaN layer (at 900° C.). Susceptor temperature and pressure were changed to 1040° C. and 0.25 atmosphere to grow 5-micron-thick undoped GaN films. SEM images show that the silica-sphere-monolayer is located below the GaN film. The nonmonodispersity of the silica particles evident in the SEM images results from random distribution of the spheres during the spin-coating process (i.e., the spheres are not arrange in a line). Dislocations appear directly above the silica spheres. Ueda states that their results suggest that the nanostructures silica layer strongly promoted epitaxial lateral overgrowth of GaN and reduced dislocation. Increasing surface coverage of silica spheres reduced dislocations in the GaN epilayer, although reduction of GaN dislocations was limited near silica spheres. Coating the substrate with a silica-sphere monolayer prior to GaN growth increased the output optical power of LED samples by as much as 2.5 fold. The threading dislocations in the sample illustrated in Ueda's transmission electron micrograph (TEM) FIG. 3$b$ is on the order of $10^9/cm^2$. This is of the same order as can be obtained for GaN growth directly on sapphire.

BRIEF DESCRIPTION OF THE DRAWINGS

The accompanying drawings, which are incorporated in and form part of the specification, illustrate some embodiments of the present invention and, together with the description, serve to explain the principles of the invention.

In FIG. 1$a$, a layer of spheres sits atop the surface of a substrate with a significant number of threading dislocations. In FIG. 1$b$, material has been grown upward from the dislocated substrate past the spheres and coalesced to form smooth surface.

DETAILED DESCRIPTION OF THE INVENTION

Figure 1A:
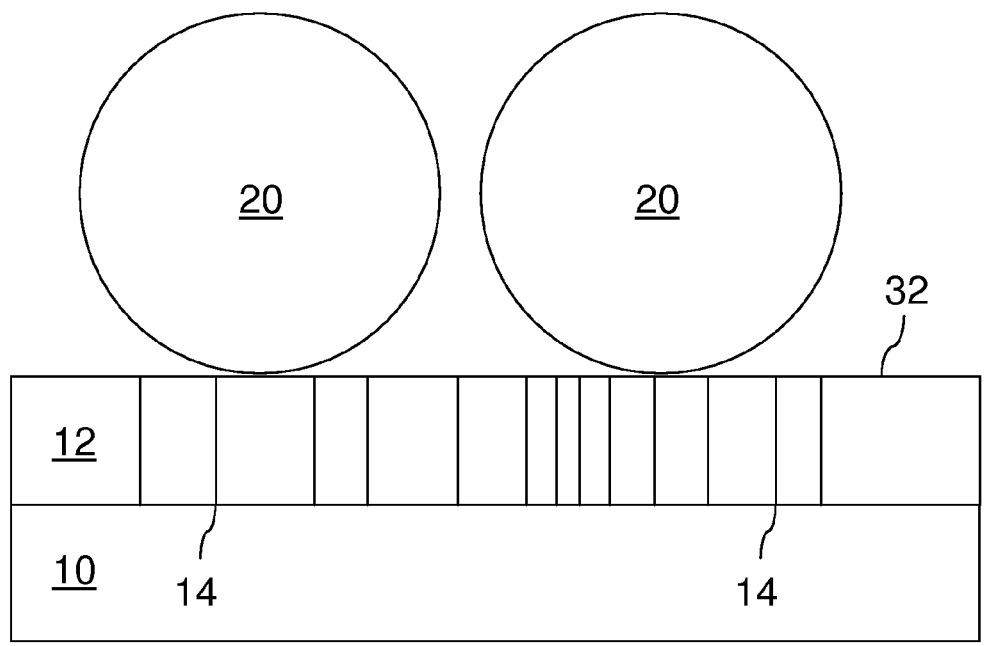
FIG. 1 illustrates a cross-sectional view of an embodiment made by one embodiment of the process of this invention.

This invention comprises a method for growing low-dislocation-density material layers on lattice-mismatched substrates. It comprises the deposition of self-assembling microspheres onto a base layer comprising the material that has been previously grown on substrate. The self-assembled spheres create a defect blocking layer as the material grows vertically around the spheres, filling the voids between spheres with epitaxially aligned material. Continued growth produces a continuous material overlayer atop the layer of spheres. The spheres atop the initial material base layer intercept vertically-propagating threading dislocations and prevent their continuation upward into the overlayer of material. The dislocation-blocking action of the sphere blocking layer enables growth of very low dislocation density material. In various embodiments, micrometer-scale spheres are self-assembled into close-packed layers using well controlled solvent evaporation conditions. These spheres create an interconnected network of voids, into which the material can be selectively grown. A single layer of spheres produces a dramatic reduction in the threading dislocation density. Reduction in threading dislocation density is also obtained when the layer of spheres comprises greater than one monolayer. The largest fraction of the reduction in dislocation density is obtained with substantially one monolayer of spheroidal particles. In some embodiments, the improvement obtained with multiple layers is not significantly greater than with a single layer. While threading dislocation density is reduced with the multilayer assemblies compared to growth without any spheres, formation of grain boundaries can occur. Spheres block and filter out substantially vertically propagating dislocations that are propagating directly upward into the spheres and adjacent voids or that that are propagating sufficiently close to the spheres that the dislocations bend into the spheres or associated voids. Dislocations terminate upon encountering a void or sphere. A dislocation that terminates at either location is defined as terminating adjacent to the spheroidal particles. Following this defect filtering, coalescence of a smooth and continuous material film results above the top sphere layer. This self-assembly-based technique provides defect filtering, controlled simply by the size of spheres and number of sphere layers deposited, without any lithography, and allows for a single material growth step to be used to obtain low-dislocation-density material layers. Embodiments of this invention are described below in terms of demonstrated embodiments using a compound semiconductor, in this case GaN, that is commonly grown on a lattice-mismatched substrate, but the process is quite general and is also applicable to many other semiconducting and non-semiconducting materials where threading-dislocation-density reduction and/or crack reduction is desired.

The spheroidal particle provides a curved interface with the growing material that serves to terminate dislocations propagating into the interface either directly or as a result of the dislocation being redirected toward the interface. The gently curved geometry in the region where lateral growth becomes important to produce a coalesced film avoids the sharp corners, such as are found at the edge of epitaxial lateral overgrowth (ELO) masks, that lead to wing tilt and the resulting generation of dislocations upon coalescence of tilted wings.

Figure 1B:
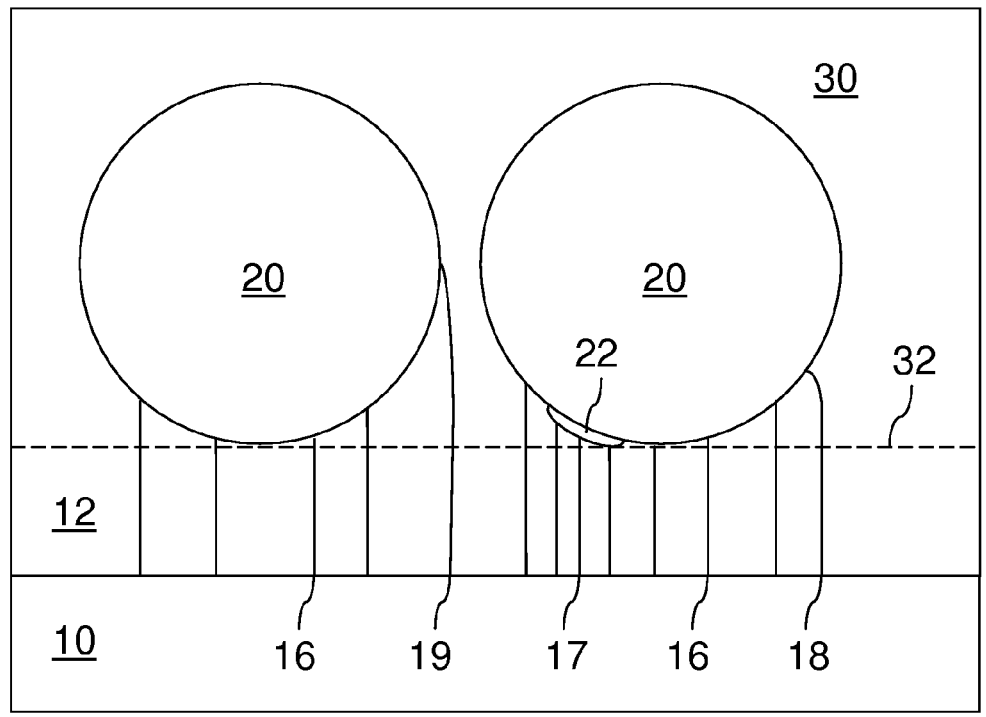
Figure 2:
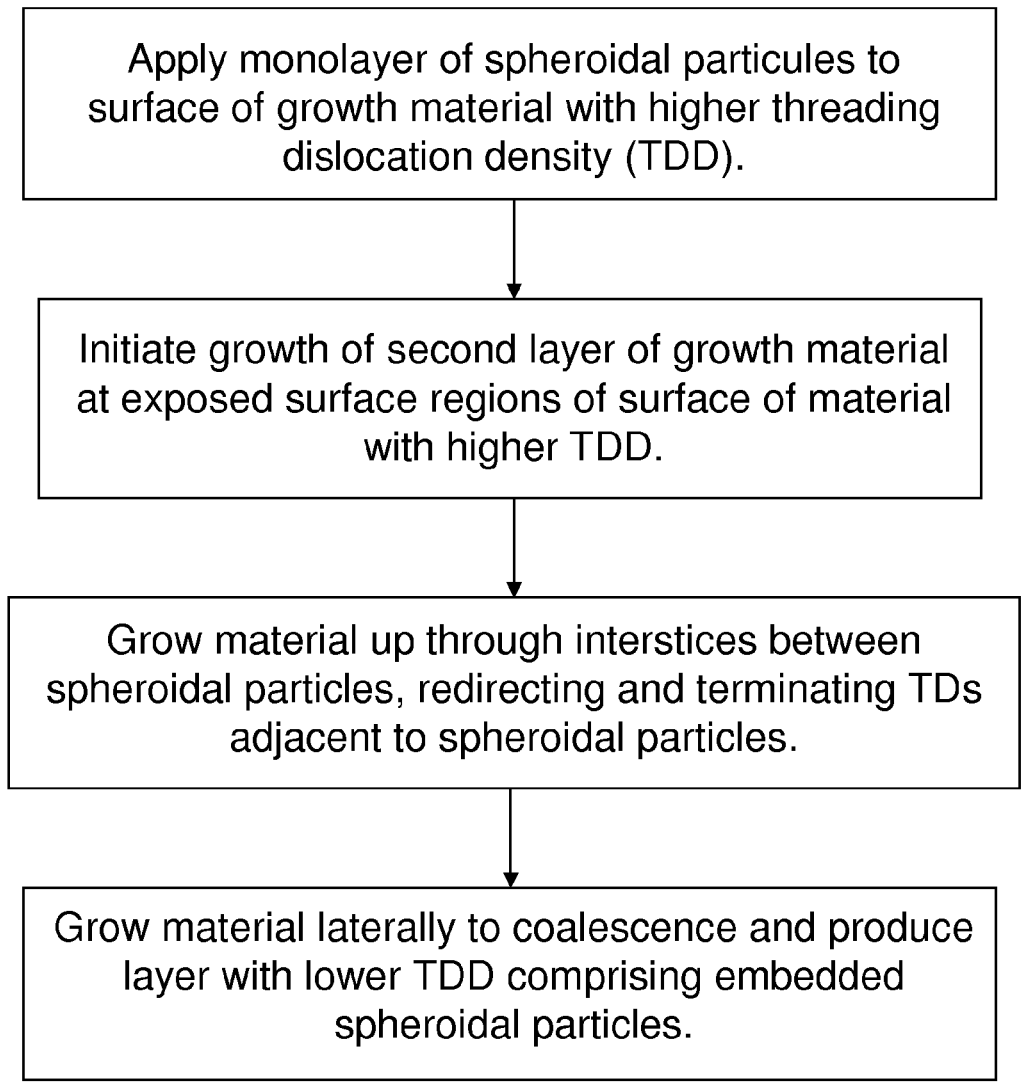
FIG. 2 illustrates a flowchart for an embodiment.

FIG. 1 illustrates an embodiment of this invention; dimensions are not to scale. A flowchart of the embodiment is illustrated in FIG. 2. Atop a substrate 10, a layer 12 of the desired material is grown. Because of lattice mismatch and/or differences in thermal expansion coefficients, many threading dislocations 14 can be present in layer 12. Atop the material layer 12, a layer of spheres 20 is applied. Surface treatments may be employed to facilitate the application or adherence of the spheres to establish and maintain their contact with the material layer. This is illustrated in FIG. 1a. Following return to the material growth reactor, additional growth (regrowth) of the material upward from the surface 32 of the initial material layer 12 past the layer of spheres is performed to form a layer 30 in which the spheres are embedded. This is illustrated in FIG. 1b. Some dislocations 16 can be terminated when they propagate vertically into the sphere. Other dislocations 18 and 19 that do not propagate straight into a sphere are bent toward the sphere as they propagate upward. As the material grows, some voids 22 may form at the underside of a sphere 20. Dislocations 17 that intercept the void are removed. Since the role of the spheres is the interception and/or redirection of threading dislocations that are propagating upward from the base layer 12 into the material layer 30 that is growing into the voids between the spheres and then over the spheres, a greater reduction in threading dislocations in the final material layer 30 will result when the base layer surface is more completely covered by spheres before subsequent growth. In addition, starting with a material base layer 12 with a lower initial dislocation density can improve the final dislocation density in the regrown layer 30.

Figure 3:
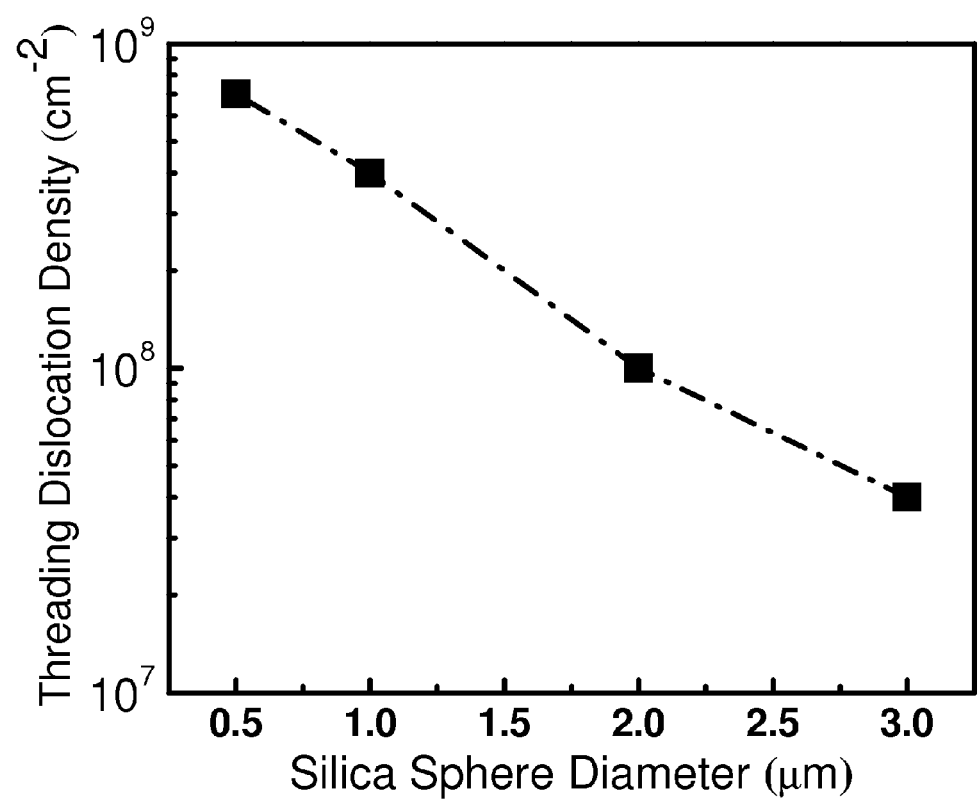
FIG. 3 illustrates the effect of particle size on the threading dislocation density in GaN.

The size of the spheres employed affects the degree of dislocation reduction. FIG. 3 presents the threading dislocation density as a function of microsphere diameter. The results for monolayers of spheres up to 3 micrometers in diameter are presented in the figure. In general, the reduction in threading dislocation density is greater with larger spheres. Spheres of larger diameter than 3 micrometers may also be employed. There is a practical rather than a fundamental limitation to the upper diameter that one may choose to employ. While larger diameter spheres produce a greater reduction in dislocation density, they also require the growth of a thicker layer of material before the sphere is embedded and the materials coalesces atop the sphere to form a planar surface. The growth of the thicker layer increases the amount of reactor time required to provide the low-dislocation-density surface that can be subsequently employed, for example, as a low-dislocation-density substrate for electronic and optical devices. If longer reaction times are acceptable, larger spheres may be used for even greater dislocation reduction. Spheres between approximately 100 nm and 100 micrometers can be used in various embodiments.

The dislocation density was measured for structures grown with different sizes of sphere. Atomic force microscopy (AFM) images and cathodoluminescence (CL) have been used to examine the threading dislocation density following growth at 1050° C. at 450 Torr for 3 hours. The starting substrate had a treading dislocation density of approximately $3 \times 10^9/cm^2$. With 500-nm silica spheres, 185 dislocations were counted in a 3×3 micrometer area, corresponding to a dislocation density of $7.4 \times 10^8/cm^2$. With 1-micrometer silica spheres, 105 dislocations were counted in a 3×3 micrometer area, corresponding to a dislocation density of $4.2 \times 10^8/cm^2$. With 2-micrometer silica spheres, 36 dislocations were counted in a 3×3 micrometer area, corresponding to a dislocation density of $1 \times 10^8/cm^2$. With 3-micrometer silica spheres, 2 dislocations were counted in a 3×3 micrometer area, corresponding to a dislocation density of $4 \times 10^7/cm^2$. Larger spheres were not examined as part of this data set due to the limited growth time, but it is to be expected that further reduction in threading dislocation density may be achieved with larger spheres. The significant reduction in threading dislocation density achieved by growth through the 3-micrometer silica spheres is further confirmed by cathodoluminescence (CL) imaging over a much larger 27.5×27.5 micrometer area. For an area grown without the silica sphere layer, the dark spots corresponding to nonradiative recombination in the vicinity of dislocations in the CL image are too dense to be individually resolved. For the GaN layer with the 3-micrometer silica sphere layer, a dislocation density of $4.0 \times 10^7$ $cm^{-2}$ is measured based on the density of the dark spots.

Three mechanisms contribute to the large reduction in threading dislocation (TD) density in embodiments of this invention. The first mechanism is the direct dislocation blocking by the silica spheres. In epitaxial lateral overgrowth (ELO), TDs propagating in the vertical direction are blocked by the dielectric overlayer. Material overlying the dielectric layer is grown laterally over the mask as growth proceeds laterally from the GaN that has grown upward through the window strip area. Fewer dislocations are found in the laterally grown material than in the vertically grown material.

The reduction in TD density obtained with embodiments of this invention is not explained only by direct TD blocking. In that case, one might expect a TD density reduction of approximately 6 fold, as calculated by the ratio of total substrate area to the opening area between the neighboring spheres. However, a reduction in TD density of nearly two orders of magnitude is observed on the regrowth layer. This reduction can be attributed to dislocation bending that serves as a highly effective method for reduction of vertically propagating TDs. In cross-sectional TEM (XTEM) images of structures grown using the method of this invention, the redirecting of vertically propagating dislocations to intercept the spherical nanoparticles is observed, as illustrated schematically in FIG. 1. In some cases, TDs 18 may change their propagating directions to an angle that is approaching normal to the GaN/silica interface. This phenomenon may be explained by the dislocation following a path of minimum elastic energy per unit of growth length of materials. In an ideal isotropic crystal with a constant energy factor k for different orientations, there is a tendency for a dislocation to bend to try to achieve a vertical orientation with respect to a crystal surface or an interface with dielectric materials in order to minimize the dislocation's its total length. In an anisotropic crystal, such as GaN, the TD bending angle is additionally influenced by the magnitude of its Burger's vector, the orientation of the dislocation, and the orientation of GaN surface/interface. Creating a large-area growth surface or interface is beneficial for bending dislocations. In typical ELO, the growth surface is limited by facet formation, which is strongly influenced by the growth conditions. For typical ELO template designs and typical GaN facets that form during ELO, the GaN surface is less than 0.5 units per unit of the substrate area. In embodiments of this invention, the GaN/dielectric interface is defined by an array of close-packed silica spheres. For the geometry of close-packed spheres; the interface area is approximately 7.2 per unit substrate surface area. This very large growth interface is highly efficient for bending TDs. Additionally, the sides of silica spheres create a deeply inclined growth interface, which may bend dislocations 19 that are not directly terminated by the silica and which might potentially escape through the openings between the neighboring spheres if not bent. In addition, TD bending occurs not only near the silica but also in the region above the spheres. This addition bending may due to the faceted island formation when GaN is selectively grown in the windows exposure at the openings between the spheres. These bending mechanisms together contribute to the observed dislocation reduction.

Figure 4A:
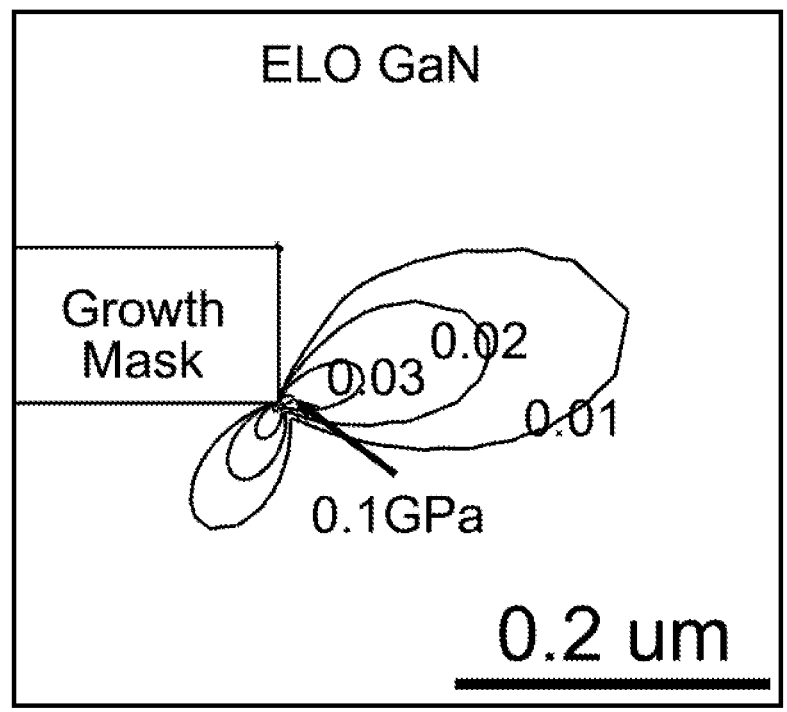
FIG. 4 presents the shear strain profile in GaN grown adjacent to a sharp-cornered ELO mask (4$a$ and 4$c$) and adjacent to a spheroidal particle (4$b$ and 4$d$).
Figure 4B:
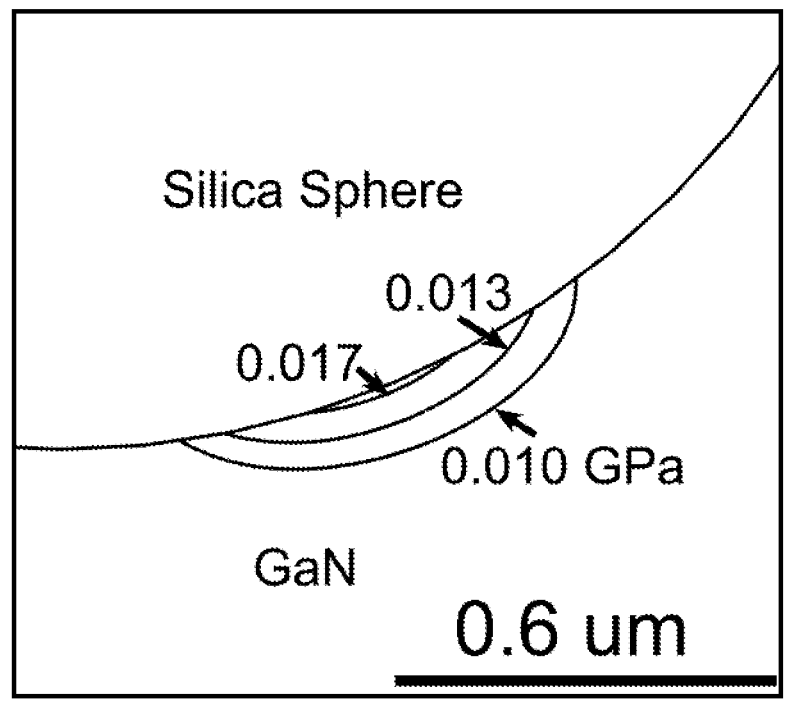
Figure 4C:
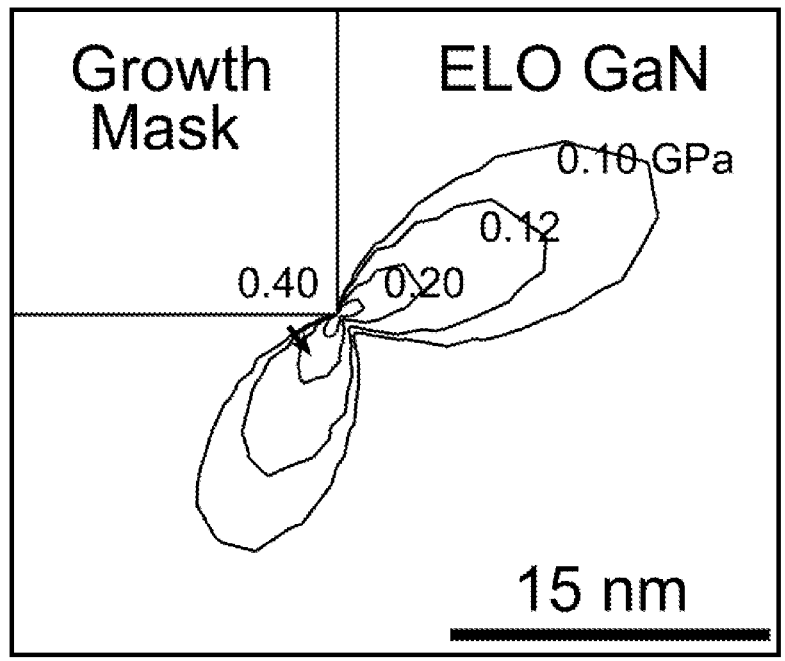
Figure 4D:
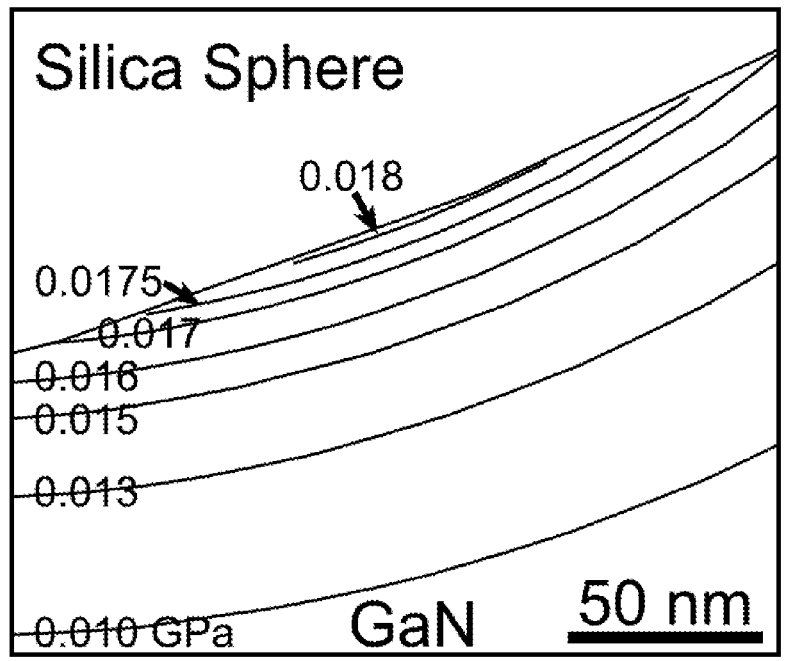

In typical ELO, TDs form at the interface where the laterally growing material coalescences over the dielectric growth mask. This phenomenon is generally attributed to tilting of the laterally growing GaN (GaN wing tilt) due to the presence of high-intensity shear strain in the GaN near the corner of the dielectric growth mask. In embodiments of this invention, sharp corners are not present at the nitride/dielectric interface but are replaced by curved surfaces. The curved surfaces do not display high-intensity shear strain. FIG. 4 illustrates results of a calculation of the static shear strain intensity and strain energy density in GaN around $SiO_2$ spheres using finite element analysis. In the calculation, a uniform shrinkage of a GaN epilayer is imposed to simulate an experimentally observed growth-related tensile strain on the order 0.2 GPa in a planer GaN epilayer on sapphire. The same magnitude of shrinkage is then applied to the silica spheres sample geometry for the strain distribution calculation. In FIGS. 4a and 4c, the calculated strain in an ELO geometry is presented, where the seed window strip width, growth mask width, and the growth facet are set to 3 micrometers, 9 micrometers, and 60°, respectively. A maximum shear strain of approximately 0.4 GPa is found near the corner of the silica growth mask. This high value can to multiply dislocations and cause the tilting of GaN wing regions. For the microspheres presented in FIGS. 4b and 4d, the maximum shear strain of approximately 0.02 GPa occurs near the bottoms of the spheres. High-intensity shear strain is largely eliminated due to the gradual curvature of the spherical surface. The absence of the high shear strain minimizes the GaN wing tilt as the GaN grows laterally over the top of the spheres and prevents the dislocation generation so typical of ELO when GaN coalesce over the silica spheres. The more gradual curvature of the larger spheres may at least in part contribute to the much lower TD density observed with the larger spheres.

Vertically propagating threading dislocations are generally absent directly over the spheres when the spheres are situated atop a GaN substrate layer. This is the opposite of the situation observed when the spheres are directly in contact with non-nitride base substrate as in the method of Ueda. In the method of Ueda, vertically propagating threading dislocations are reported to occur directly over the silica spheres. This is in contrast to the virtual absence of vertically propagating dislocations directly over the silica spheres in this present invention.

In selecting a particular sphere size to employ in various embodiments, the length of time required to embed the sphere and grow the thicker material layer needed to form the coalesced layer over the top of the larger spheres is of consideration. Practical time constraints on how long one wants to grow to achieve a coalesced planar surface may be as important as the desire to further reduce the threading dislocation density. Such considerations can be decided in light of the application intended for the final coalesced structure.

In addition to curvature effects, larger spheres may contribute some improvement in material quality because there are fewer openings per unit area up through which the material will be growing. This can reduce problems that may arise from the coalescence intersection of laterally growing material that may possess slightly different orientations.

In one embodiment, a 2-micrometer-thick GaN base layer was first deposited onto c-plane sapphire (the base substrate) using metal-organic chemical vapor deposition (MOCVD) This GaN growth on sapphire employed a low-temperature GaN buffer technique, resulting in a threading dislocation density of $3 \times 10^9/cm^2$, as measured by cathodoluminescence and AFM imaging. The base layer was treated either with a mixture of $H_2O_2$ and $H_2SO_4$ or an oxygen plasma to produce a hydrophilic GaN surface for the silica microsphere assembly. A monolayer of silica microspheres were assembled on the GaN surface as follows. A hydrophobic surface is prepared on silica spheres. Various processes can be employed to obtain hydrophobic silica surfaces and can be used; such surface treatments are known to those of skill in the art and many would be suitable for use as the pretreatment in embodiments of this present invention. In this embodiment, silica spheres were dissolved in ethanol. The silica surface was made hydrophobic by addition of allyltrimethoxysilane to the ethanol suspension. Excess surfactant was removed by centrifugation and dialyzation against chloroform. The extract was dissolved in chloroform for monolayer formation. The suspension was evenly spread on a water surface in a Langmuir-Blodgett trough to form a monolayer. The hydrophilic GaN sample was pulled out of the water at a controlled rate. The samples were dried in air and no further treatment was employed before the GaN regrowth.

In one embodiment, a 2-μm-thick GaN layer was first deposited onto c-sapphire by metal-organic chemical vapor deposition (MOCVD) Trimethylgallium (TMG) and $NH_3$ were used as precursors with a flow rate of 0.11 μmol/min (2.4 sccm) and 10.5 slm, respectively. $H_2$ and $N_2$ are used as carrier gases at a flow rate of 9.5 SLM and 8 SLM, respectively. The GaN growth on sapphire employed a low-temperature GaN buffer technique, resulting in a threading dislocation density of $3 \times 10^9$ $cm^{-2}$, as measured by cathodoluminescence imaging. The samples were subsequently treated in an $O_2$ plasma or $H_2SO_4:H_2O_2$ mixture (4:1 by volume) to obtain a hydrophilic GaN surface for silica microsphere assembly.

A monolayer of silica microsphere was assembled on the GaN surface following a modified process reported by S. Reculusa and S. Ravaine, "Synthesis of Colloidal Crystals of Controllable Thickness through the Langmuir-Blodgett Technique," Chem. Mater. vol. 15 (2003) pp. 598-605. The key steps of the process are summarized as follows First, 0.25 mg of 100% of silica spheres with a diameter of approximately 3 micrometers is dissolved in 1.5 mL ethanol. To functionalize the silica surface to make them hydrophobic, 3 µl of allyltrimethoxysilane is added to the silica sphere ethanol suspension. Following mixing, the suspension is heated to approximately 90° C. while stirring for 2 hours. The suspension is then centrifuged and dialyzed against chloroform to remove excess surfactant. The extract is dissolved in 1 mL chloroform for use in monolayer formation. Approximately one hundred micro-liter of the suspension is evenly spread on a water surface in a Langmuir-Blodgett trough with a working dimension of 7.5×36.5 cm. The film is compressed at a rate of 1 mm/min. When the film area is compressed to approximately 30% of the initial area, the surface tension rapidly rises to approximately 40 mN/m. The hydrophilic GaN sample is pulled out of the water at the rate of 2 mm/min while maintaining the surface tension at 38±3 mN/m. The samples are dried in air and no further treatment is required before the GaN regrowth To achieve better reduction of threading dislocation density, growth conditions for the upper layer are selected that will produce selective growth of the growth material epitaxially from the layer of material atop the bulk substrate while not producing significant growth directly on the particles. This is achieved by selecting a temperature that is not excessively high so as to lead to loss of selectivity for growth on the growth material versus on the particles but is high enough to discourage condensation on the particles. Use if a reactive gas mixture that contains components that suppress nucleation and growth on the particles is helpful. Chemical species that adjust the particle surface chemistry to discourage the initial nucleation or that etch away any nuclei that may have formed on the particles are helpful in achieving this end. Control of the ratio of precursor gases can also help reduce any contribution to nucleation upon the particle surface. For example, for the growth of GaN, a large V-to-III ratio discourages elemental Ga formation on the particles, which can lead to polycrystalline films. Variation of the pressure during the course of the reaction can improve conditions for initial nucleation, growth upward through the interstices, facet formation, or lateral growth as may be most advantageous at different times in the total reaction.

GaN was selectively grown by MOCVD through the self-assembled sphere layer to achieve a fully coalesced GaN film. When 3-micrometer spheres were employed, an approximately 12-micrometer-thick film was grown over the sphere layer A typical growth condition contains a 45-minute GaN growth step at 450 Torr with 8.6 SCCM TMG and 10.5 SLM $NH_3$ and a 5-hour growth step at 50 Torr with 2.6 SCCM TMG and 10.5 SLM $NH_3$. For both steps, the growth temperature, $H_2$ flow rate, $N_2$ flow rate, and spin rate are 1050 C, 9.5 SLM, 8 SLM, and 1500 RPM, respectively. Samples were characterized by scanning electron microscopy (SEM), cross-sectional transmission electron microscopy (XTEM), atomic force microscopy (AMF), and cathodoluminescence (CL).

In some embodiments following self-assembly of the spheres, GaN was selectively grown by MOCVD through the interstices of the spheroidal particle layer and coalesced to produce a fully coalesced GaN layer approximately 12 micrometers thick. The spheroidal particles are encapsulated near the starting GaN layer adjacent to the base substrate. To enable imaging of the threading dislocations using atomic force microscopy (AFM), the GaN surface was exposed to $SiH_4$ at 860° C. for approximately 2 min. The samples were characterized by scanning electron microscopy (SEM), cross-sectional transition electron microscopy (XTEM), AFM, and cathodoluminescence (CL). TEM samples were prepared by focused ion beam.

When approximately 3-µm silica spheres are assembled on a GaN-on-sapphire substrate, the silica spheres form close-packed domains with dimensions on the order of approximately 40 µm. From an SEM image of the surface, a silica sphere density was measured to be 1183 $mm^{-2}$. This density translates into a surface coverage of 83.6% by the silica microspheres, which is close to the maximum coverage (90.7%) that would be produced by a silica sphere array of ideal close packing. The difference between the observed coverage and the ideal coverage is probably due to sphere stacking disorders occurring on the domain boundaries and to vacancies present within the domains.

In some embodiments, the gallium nitride that grows through the interstices and around the spheroidal nanoparticles and coalesces to form an approximately planar low-dislocation-density layer was grown as follows. Trimethyl gallium (TMG) at a flow rate of 0.11 micromole/min (8.6 sccm) and ammonia at a flow rate of 10.5 slm were used. Reaction was conducted for 45 min. at a pressure of 450 Torr. Pressure and TMG were decreased to 50 Torr and 2.6 sccm, respectively; reaction was continued for 5 hours. The reaction temperature was approximately 1050° C.

Other pressures and temperatures may be used in different embodiments of this invention. Reaction conditions that produce good vertical growth rates can be used for initiation of growth and growth of material upward through the interstices. For GaN, temperatures between approximately 500° C. and approximately 1400° C. may be employed. For a particular set of reaction conditions, a temperature that does not facilitate direct nucleation of GaN on the microspheres produces better quality material. The initiation step can be performed with pressures between approximately 200 Torr and approximately 760 Torr. Higher pressures tend to favor vertical growth over lateral growth, so pressures between approximately 200 Torr and 760 Torr may be used. Lower pressures favor lateral growth to achieve coalescence. Pressures between approximately 1 Torr and approximately 200 Torr favor lateral growth.

While the base substrate in some of the preceding embodiments was sapphire, other substrates may also be employed. Substrates suitable for embodiments of this invention for the growth of Group III nitrides include but are not restricted to a higher-dislocation-density Group III nitride itself, GaN, sapphire, silicon carbide, silicon, germanium, ZnO, MgO, $MoS_2$, $MgAl_2O_4$, $NdGaO_3$, AlN, GaAs, GaP, Hf, Sc, Zr, TiN, ScN, ZrN, and $LiGaO_2$. A variety of precursor gases may be used for the growth of Group III nitride materials in embodiments of this invention. Examples include but are not restricted to Group III precursor selected from the group consisting of trimethyl gallium, triethyl gallium, gallium trichloride, gallium-containing hydrocarbon compounds, trimethyl aluminum, triethyl aluminum, aluminum trichloride, aluminum-containing hydrocarbon compounds, trimethyl indium, triethyl indium, indium trichloride, and indium-containing hydrocarbon compounds, and a Group V precursor selected from the group consisting of ammonia and nitrogen.

In some embodiments, it is desirable to employ conditions that inhibit nucleation and growth of the growth material directly on the spheroidal particles. Condition that inhibit such nucleation and growth include but are not restricted to those whose mechanisms discourage the initial nucleation process and also those that etch away any nuclei or growing material that might begin to form on the particles' surfaces. In embodiments involving GaN, these include high growth temperature, or low growth pressure, or introducing H and/or Cl containing gas species such as $H_2$, $NH_3$, $Cl_2$, HCl, $GaCl_2$ in MOCVD, HVPE, or CVD (chemical vapor deposition) reactors.

The preceding discussion was presented in terms of embodiments where the spheres were placed upon a GaN-on-sapphire substrate. Alternative Group III nitrides can also be employed, as can alternative base substrates upon which the Group III nitride is grown before application of the layer of spheroidal particles. For example, in another embodiment, a Si(111) wafer was employed as the base substrate. A compositionally graded buffer layer was grown as follows. A Si(111) wafer was heated to 1100° C. Trimethylaluminium (TMA) and ammonia were introduced at a flow rate of 0.2 sccm and 2.5 slm, respectively. This initial growth was performed for approximately 15 min and approximately 30 nm of AlN was grown on the Si(111) surface. A graded-composition GaAlN layer was then grown on the initial AlN layer over a period of approximately 25 minutes by gradually increasing trimethylgallium (TMG) flow rate from 0 to 2.5 sccm, increasing $NH_3$ flow rate from 2.5 to 10.5 slm, decreasing the growth temperature from 1100 to 1050° C., and decreasing the TMA flow rate from 0.2 to 0 sccm. A layer of approximately 0.5 micrometer-thick GaN was then grown at 1050° C. and with TMG and $NH_3$ flow rate of 2.5 sccm and 10.5 slm, respectively. Flow rates, times, and temperatures may be varied in different embodiments, as know to those of skill in growing these materials, to obtain a compositionally graded buffer layer of variable thickness upon which the upper GaN layer may be grown. The thickness of the GaN layer can also be widely varied provided one achieves a substantially crack-free GaN layer upon which spheroidal particles can be deposited. The base substrate with this compositionally graded first Group III nitride layer upon it was removed from the reactor and had applied to its surface approximately a monolayer of 3-micrometer silica spheres using a Langmuir Blodgett technique. After reloading the wafers in an MOCVD reactor, a regrowth of GaN was performed using the conditions described above for growing GaN using sapphire-based substrates. The dislocation density of the resulting substrate structure was measured using large-area cathodoluminescence scans. The measured dislocation density was approximately $6 \times 10^7/cm^2$. For comparison, growth under the same conditions but without the sphere layer produced GaN with a dislocation density on the order of $10^{10}/cm^2$.

For many materials, substrates of the material itself that have higher dislocation densities than desired may be available. For materials where growth kinetics in different crystallographic directions enable selective lateral growth approaches, embodiments of this invention can produce lower dislocation-density surfaces. Embodiments of this invention may be used to produce lower dislocation densities that those initially present in such cases. In such embodiments, the spheroidal particles are applied to the surface of the higher dislocation density material. A surface treatment may or may not be employed to obtain good adhesion of the spheroidal particles to the material so that the particles remain substantially in contact with the higher dislocation density material. After application of the particle layer, growth or regrowth of the material to embed the particles is performed. The threading dislocations propagating up from the higher dislocation density layer are redirected and/or terminated when they encounter the surface of the particles that face toward the higher dislocation density layer or encounter voids adjacent to that part of the surface of the particles. This portion of the surface may be described as the hemispherical portion facing toward the higher dislocation density material although the shape of the surface need not be exactly hemispherical. The material that grows past the particle and laterally across the hemispherical surface that faces away from the higher dislocation density material will have a dislocation density that is at least an order of magnitude lower than that of the higher dislocation density material. One such embodiment would be the growth of lower dislocation density GaN on a higher dislocation density GaN wafer.

While the preceding embodiments and descriptions have employed the terms spheres and balls, it is to be recognized that the invention also includes nonspherical shapes that can serve to intercept and divert vertically propagating threading dislocations as the material of interest is being grown vertically upward from the substrate layer of the material through the void regions between shapes. Suitable shapes include but are not restricted to spheres, spheroids, ellipsoids, cylinders, and discoids. It is intended that these shall be included in the term spheroidal particles. In using the term diameter, it is to be understood that the term is not to be construed as limited to particles that are necessarily spherical particles with uniform diameter in all directions, but may be construed to indicate more generally the lateral dimension of the particles. It is not essential that all the particles employed in a particular embodiment have the same effective diameter as long as they in concert are able to provide the desired physical effect of terminating the propagation of the threading dislocations.

While Langmuir-Blodgett techniques have been employed in the embodiments described above to produce the spatially dense layer of spheroidal particles, other techniques that can produce particles layers with substantially similar properties may be used. This would include but not be restricted to spin casting and drop casting.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for making reduced-dislocation-density material, comprising:

applying at least one monolayer of spheroidal particles to a substrate comprising a base substrate and a first layer of growth material, the at least one monolayer having interstices between the spheroidal particles oriented to permit access of reactant gases to the first layer of growth material;

initiating growth of a second layer of growth material at sites on the first layer of growth material that are exposed to reactant gases through the interstices;

growing the growth material through the interstices;

terminating adjacent to the spheroidal particles a plurality of threading dislocations propagating through the growth material;

coalescing the growth material growing through adjacent interstices to embed the at least one monolayer of spheroidal particles within the second layer of growth material to form a second layer of growth material with reduced dislocation density;

applying a second at least one monolayer of spheroidal particles atop the second layer of growth material, the second at least one monolayer having a second set of interstices between the spheroidal particles oriented to permit access of reactant gases to the second layer of growth material;

initiating growth of a third layer of growth material at sites on the second layer of growth material that are exposed to reactant gases through the second set of interstices;

growing the growth material through the second set of interstices; and coalescing the growth material growing through adjacent interstices to embed the second at least one monolayer of spheroidal particles within the third layer of growth material to form a third layer of growth material with reduced dislocation density.

2. The method of claim 1, wherein the step of applying the at least one monolayer of spheroidal particles comprises the steps of preparing the monolayer of spheroidal particles using a Langmuir Blodgett technique; and applying the monolayer of spheroidal particles to the first layer of growth material using a Langmuir Blodgett coating technique.

3. The method of claim 1, wherein the step of applying the at least one monolayer of spheroidal particles comprises applying a suspension of spheroidal particles to the substrate by a spin-coating technique or a drop-coating technique.

4. The method of claim 1, wherein the monolayer consists of spheroidal particles arranged substantially in a close-packed geometry.

5. The method of claim 1, wherein the spheroidal particles comprise a material selected from the group consisting of silicon dioxide, silicon nitride, silicon oxynitride $Al_2O_3$, $TiO_2$, $ZrO_2$, $Fe_3O_4$, $ZrHfO_4$, $ZrHfO_4$, $CaCO_3$, and glass.

6. The method of claim 1, wherein the step of growing the growth material through the interstices at least in part employs reaction conditions that form faceted structures suitable for promoting redirection of threading dislocations away from a vertical propagation direction.

7. The method of claim 6, wherein the step of coalescing the growth material employs reaction conditions that promote lateral growth of the growth material.

8. The method of claim 1, wherein the steps of initiating growth, growing the growth material through the interstices, terminating the plurality of threading dislocations, and coalescing the growth material are performed at a temperature between approximately 500° C. and approximately 1400° C.

9. The method of claim 1, wherein at least one of a carrier gas and the reactant gas inhibits nucleation and growth of the growth material directly on the spheroidal particles.

10. The method of claim 1, wherein the spheroidal particles have a diameter greater than approximately 100 nm and less than approximately 100 micrometers.

11. The method of claim 1, wherein the growth material is a Group III nitride.

12. The method of claim 11, wherein a growth pressure is between approximately 1 Torr and approximately 1 atmosphere pressure.

13. The method of claim 11, wherein a ratio of a Group V precursor to a Group III precursor is greater than approximately 100.

14. The method of claim 11, wherein a mixture of a carrier gas and the reactant gases comprises at least one gas selected from the group consisting of hydrogen, hydrogen chloride, a chlorine-containing gas, and ammonia.

15. The method of claim 11, wherein the reactant gases comprise a Group III precursor selected from the group consisting of trimethyl gallium, triethyl gallium, gallium trichloride, gallium-containing hydrocarbon compounds, trimethyl aluminum, triethyl aluminum, aluminum trichloride, aluminum-containing hydrocarbon compounds, trimethyl indium, triethyl indium, indium trichloride, and indium-containing hydrocarbon compounds, and a Group V precursor selected from the group consisting of ammonia and nitrogen.

16. The method of claim 1, wherein the step of initiating growth is performed at a pressure between approximately 200 Torr to approximately 760 Torr, wherein the step of growing the growth material through the interstices is performed at a pressure between 1 Torr and approximately 760 Torr, wherein the step of coalescing the growth material is performed at a pressure between approximately 1 Torr and approximately 200 Torr, and wherein the steps are performed at a temperature between approximately 900° C. and 1300° C.

17. The method of claim 1, wherein the steps of initiating growth, growing the growth material, terminating the plurality of threading dislocations, and coalescing the growth materials are performed in a chemical vapor deposition reactor or a hydride vapor phase reactor.

* * * * *